s008462512B2

United States Patent
Zhang

(10) Patent No.: US 8,462,512 B2
(45) Date of Patent: Jun. 11, 2013

(54) CHIP CARD HOLDER AND ELECTRONIC DEVICE USING THE SAME

(75) Inventor: Bing Zhang, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 302 days.

(21) Appl. No.: 12/907,098

(22) Filed: Oct. 19, 2010

(65) Prior Publication Data

US 2012/0020034 A1  Jan. 26, 2012

(30) Foreign Application Priority Data

Jul. 26, 2010  (CN) .......................... 2010 1 0236810

(51) Int. Cl.
*H05K 1/14* (2006.01)
(52) U.S. Cl.
USPC ............................ 361/737; 361/752; 361/807

(58) Field of Classification Search
USPC ................. 361/736–737, 752–753, 807–810; 439/326–331
See application file for complete search history.

(56) References Cited

U.S. PATENT DOCUMENTS

| | | | | |
|---|---|---|---|---|
| 6,231,365 | B1 * | 5/2001 | Konno et al. ................. | 439/331 |
| 7,798,858 | B1 * | 9/2010 | Zuo .............................. | 439/630 |
| 8,023,285 | B2 * | 9/2011 | Zhu .............................. | 361/810 |
| 2009/0280670 | A1 * | 11/2009 | Feng ............................ | 439/326 |
| 2010/0055965 | A1 * | 3/2010 | Qing ............................ | 439/370 |

* cited by examiner

*Primary Examiner* — Tuan T Dinh
(74) *Attorney, Agent, or Firm* — Altis Law Group, Inc.

(57) ABSTRACT

A chip card holder is used for assembling a chip card. The chip card holder includes a housing and a latching cover. The housing includes a top wall and a sidewall connected to the top wall. The top wall defines a receiving slot, and the chip card is exposed from the receiving slot. The sidewall defines an opening communicating with the receiving slot. The latching cover is rotatably assembled to the housing to cover the opening.

13 Claims, 10 Drawing Sheets

CHIP CARD HOLDER AND ELECTRONIC DEVICE USING THE SAME

BACKGROUND

1. Technical Field

The present disclosure relates to chip card holders and electronic devices using the chip card holders.

2. Description of Related Art

Many portable electronic devices have chip card holders for holding chip cards. A chip card holder usually includes a housing, a cover detachably assembled to the housing, and an ejecting mechanism assembled in the housing. The housing defines a receiving slot for receiving a chip card. When the chip card is to be taken out of the receiving slot, the cover is opened, then the chip card is pressed and the ejecting mechanism pushes the chip card to slide out of the housing. However, this type of chip card holder has a complicated structure and occupies a lot of space.

Therefore, there is room for improvement within the art.

BRIEF DESCRIPTION OF THE DRAWINGS

Many aspects of the present chip card holder and electronic device using the same can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the diagrams.

DETAILED DESCRIPTION

Figure 1:
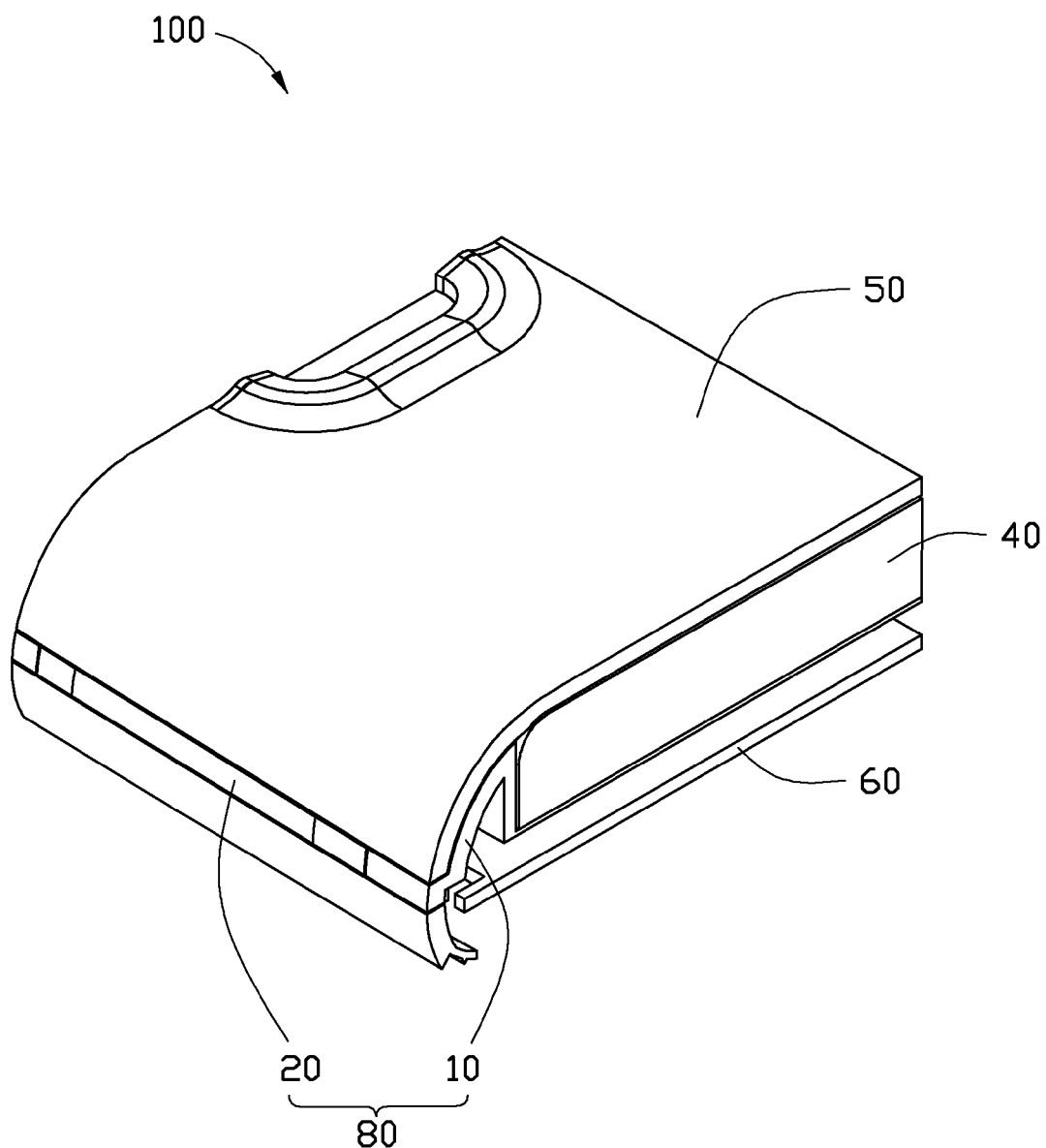
FIG. 1 is an assembled view of a chip card holder used in an electronic device, in accordance with an exemplary embodiment, the electronic device including a housing, a latching cover, a battery, a battery cover, and a printed circuit board.
Figure 2:
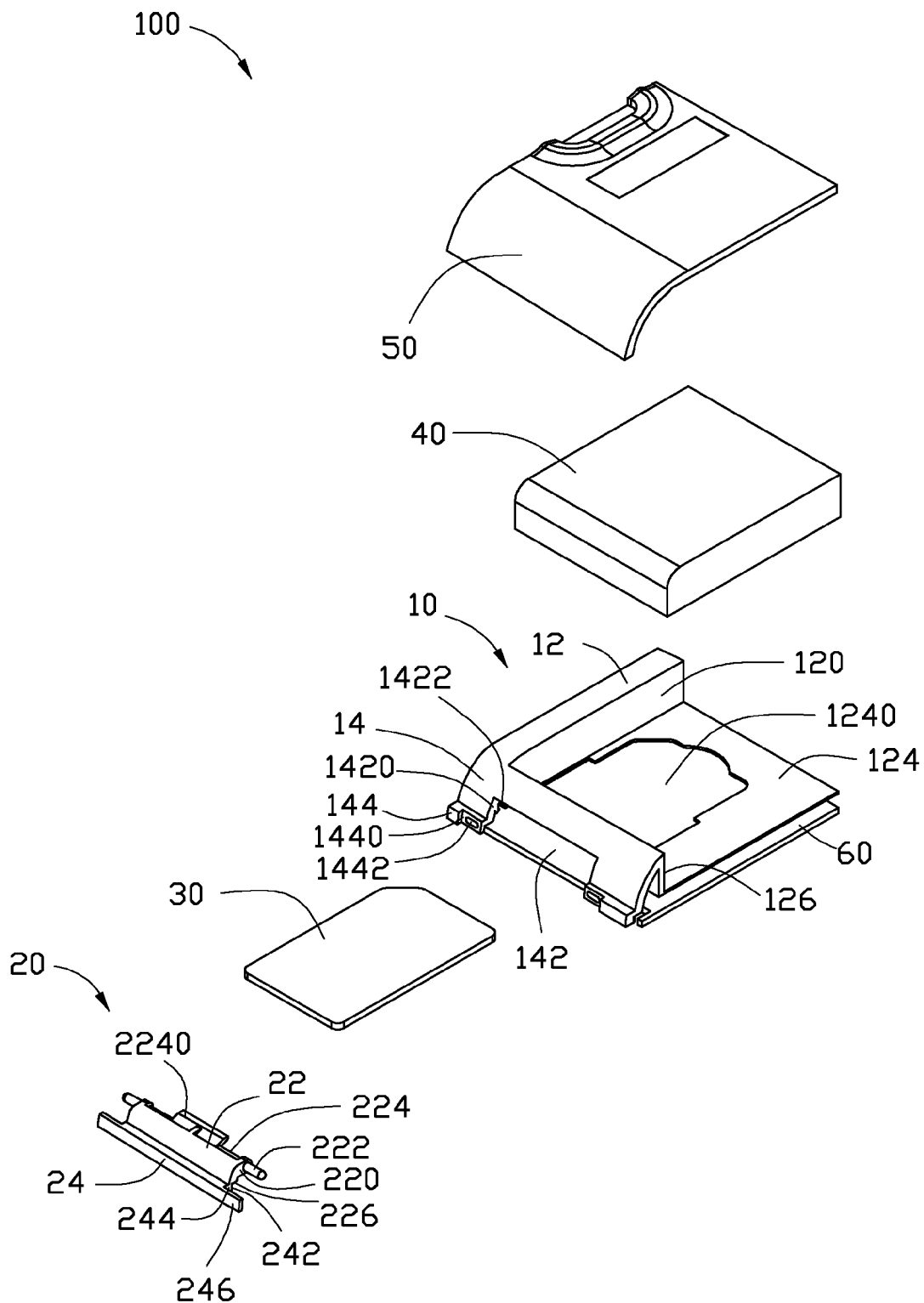
FIG. 2 is an exploded view of the electronic device shown in FIG. 1.

FIG. 1 and FIG. 2 show an exemplary electronic device 100 using a chip card holder 80. The chip card holder 80 can be applied to hold any of various kinds of chip cards such as a secure digital card (SD card), a smart media card (SM card), or a subscriber identity module card (SIM card) within the electronic device 100. The electronic device 100 includes a housing 10, a battery 40, a battery cover 50, and a printed circuit board 60. The chip card holder 80 includes the housing 10 and a latching cover 20 for receiving a chip card 30 in the electronic device 100. The latching cover 20 is rotatably assembled to the housing 10.

The housing 10 includes a top wall 12 and a sidewall 14 connected to the top wall 12. The top wall 12 defines a chamber 120 for receiving the battery 40. The chamber 120 is defined by a bottom wall 124 and a peripheral wall 126 connected to the bottom wall 124. The bottom wall 124 defines a receiving slot 1240 for receiving the chip card 30.

Figure 3:
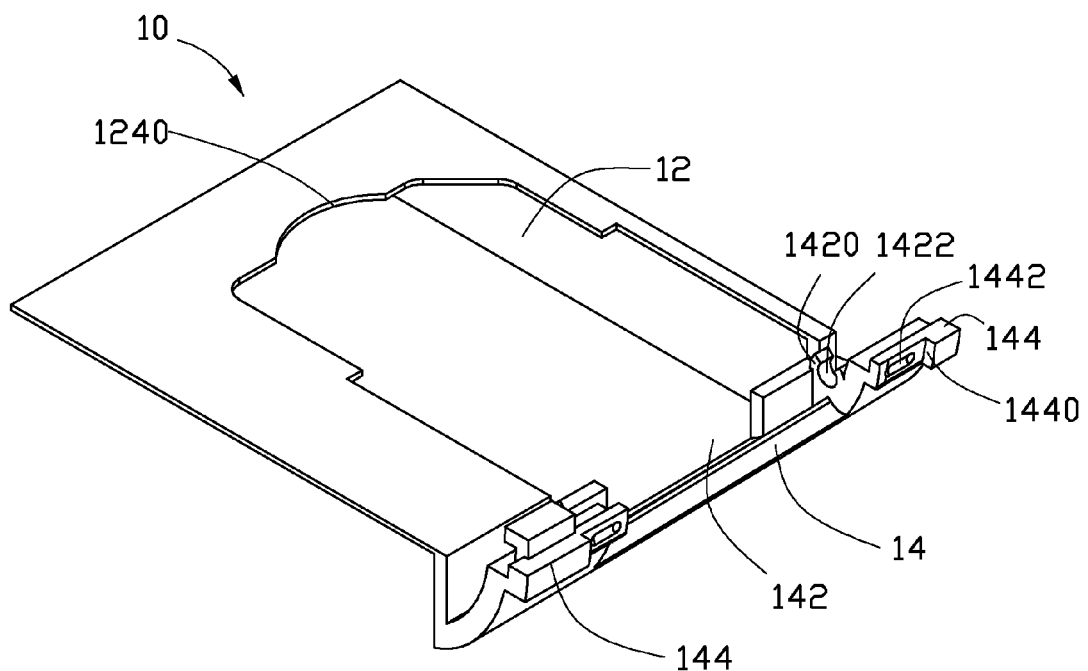
FIG. 3 is an isometric view of the housing shown in FIG. 1.

Referring to FIG. 3, the sidewall 14 and the peripheral wall 126 define an opening 142 communicating the chamber 120 with the receiving slot 1240. The opening 142 allows the chip card 30 to be inserted into the receiving slot 1240. The sidewall 14 includes two opposite latching portions 1420 adjacent to the opening 142. Each latching portion 1420 defines a hole 1422. Two bars 144 respectively extend from two opposite end portions of the sidewall 14 and are symmetrically positioned at two sides of the opening 142. Each bar 144 defines a recess 1440. Each recess 1440 defines a connecting hole 1442 for fixing the latching cover 20 to the housing 10.

Figure 4:
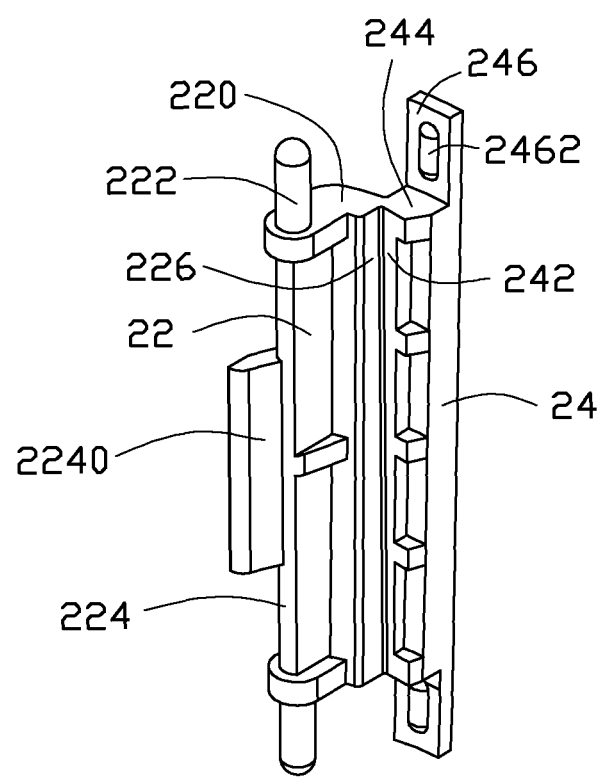
FIG. 4 is an isometric view of the latching cover shown in FIG. 1.

Referring to FIG. 4, the latching cover 20 includes a main body 22 and a latching plate 24 connected to the main body 22. The main body 22 includes two end portions 220 respectively positioned at two ends thereof, a first surface 224, and a second surface 226 opposite to the first surface 224. A shaft 222 extends from each end portion 220. The shaft 222 can be rotatably assembled in the corresponding hole 1422. A block 2240 is mounted on a middle of the first surface 224. The latching plate 24 includes a resisting end 242 and two end surfaces 244. Each end surface 244 includes a fixed block 246 extending therefrom. A semi-cylindrical projection 2462 is positioned on each fixed block 246. Each fixed block 246 can be received in the corresponding recess 1440. Each projection 2462 can be engaged in the corresponding connecting hole 1442.

Figure 5:
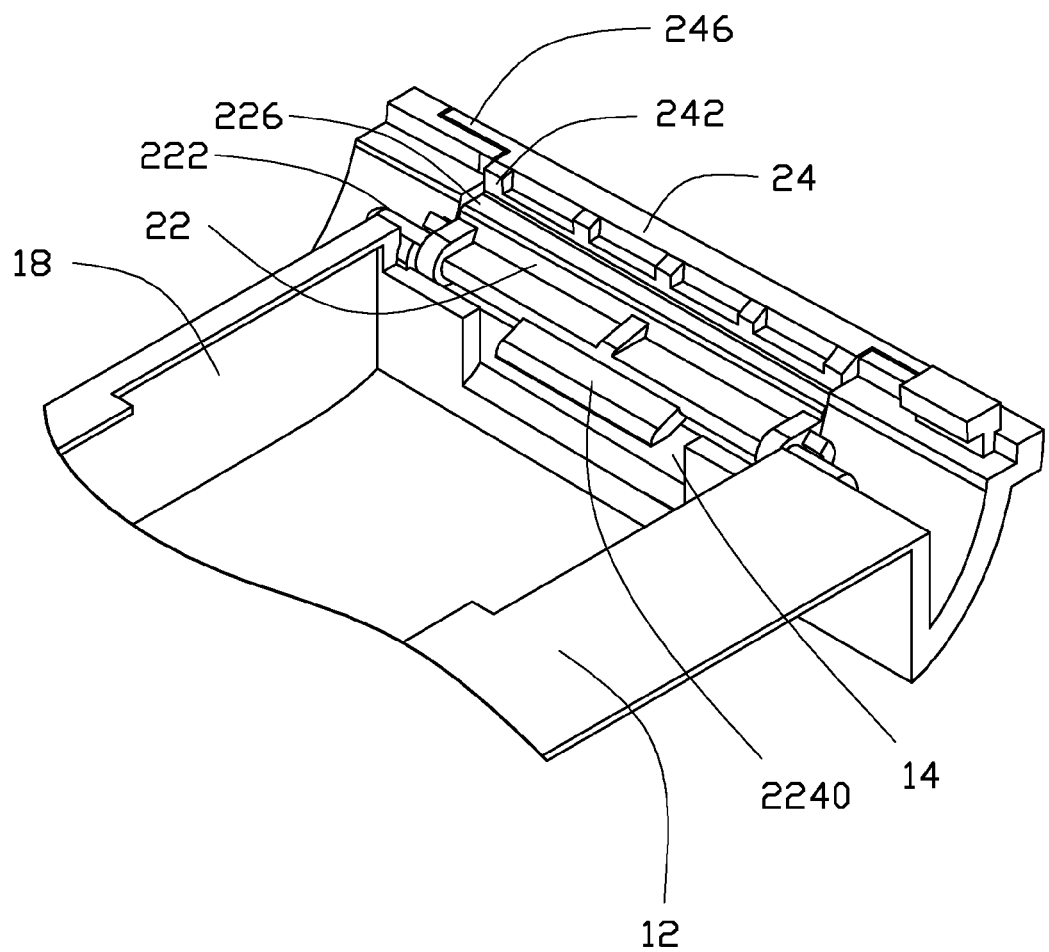
FIG. 5 is an assembled, partial isometric view of the housing and the latching cover.

Referring to FIG. 3 to FIG. 5, in assembly, the latching cover 20 is aligned with the opening 142, with the block 2240 facing the opening 142. The shafts 222 are inserted into the holes 1422, and the main body 22 is received in the opening 142. Correspondingly, the fixed blocks 246 are received in the recesses 1440, and the projections 2462 are engaged in the connecting holes 1442. Thus, the assembly of the electronic device 100 is finished, and the latching cover 20 is rotatably assembled to the housing 10.

Figure 6:
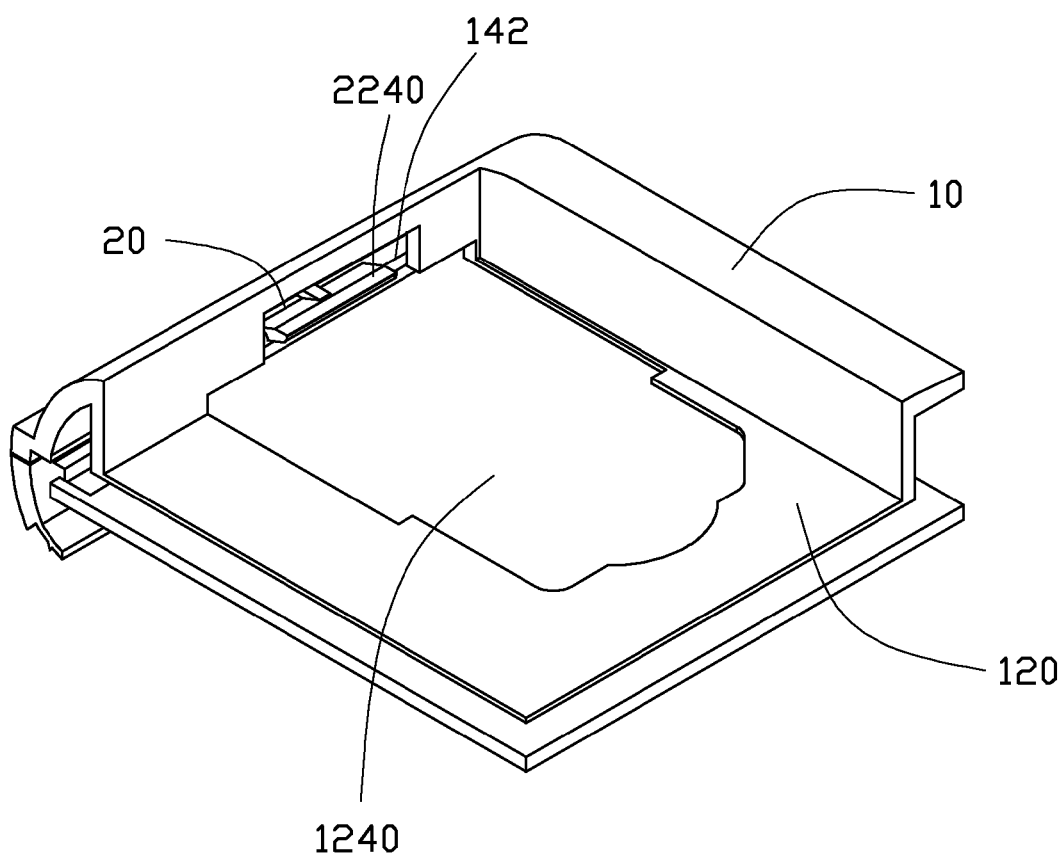
FIGS. 6 and 7 are different views of the assembled housing and latching cover ready to receive a chip card.
Figure 7:
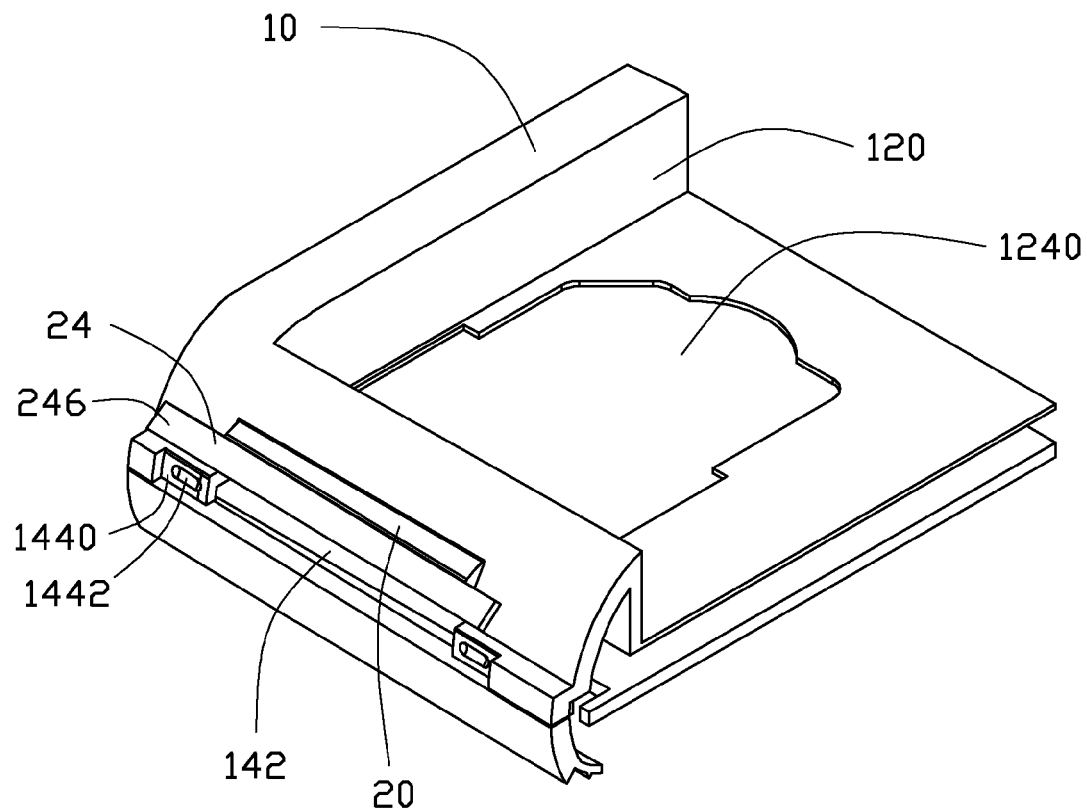
Figure 8:
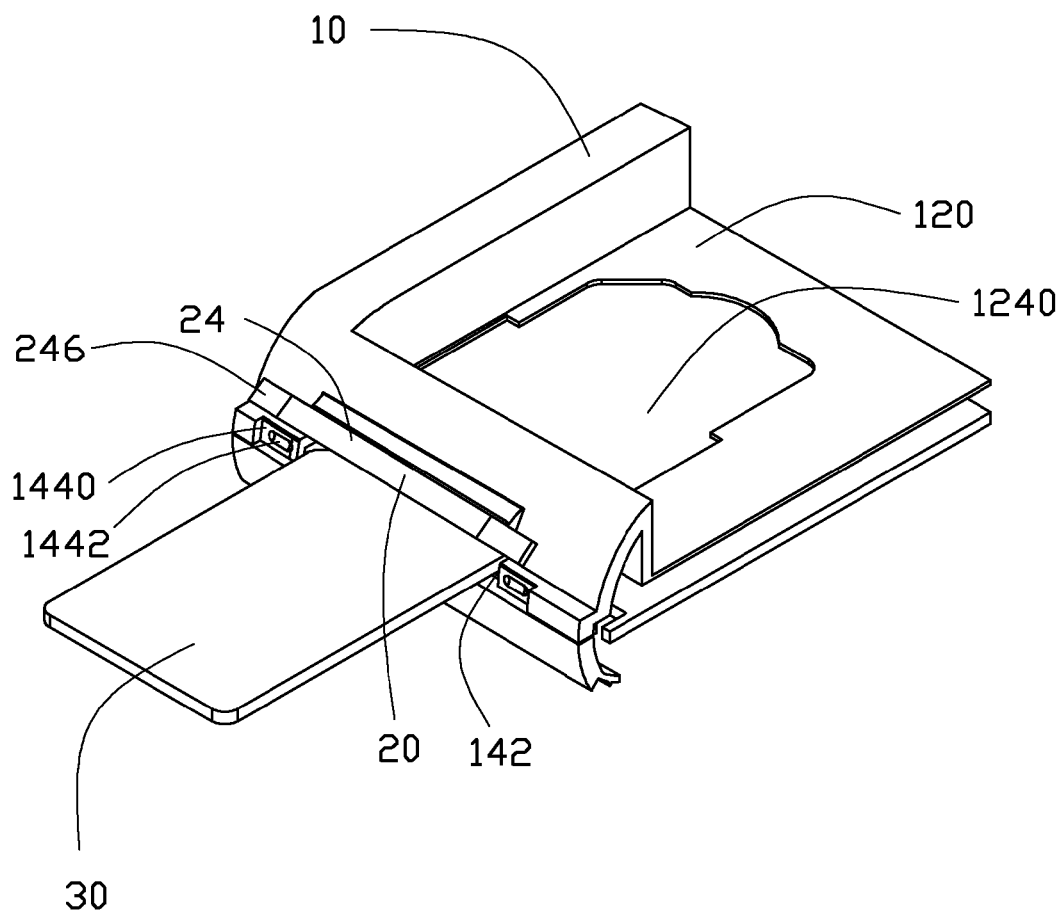
FIGS. 8 and 9 respectively show the chip card as it is first being inserted into the housing, and when it is fully received in the housing.
Figure 9:
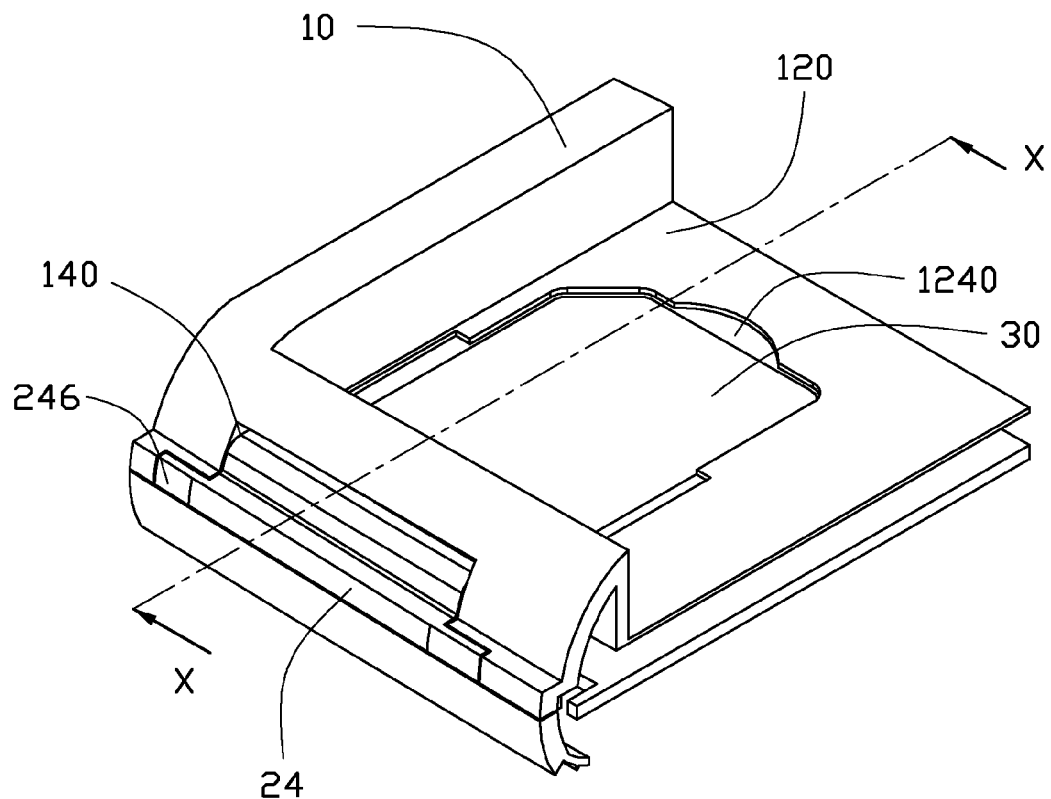
Figure 10:
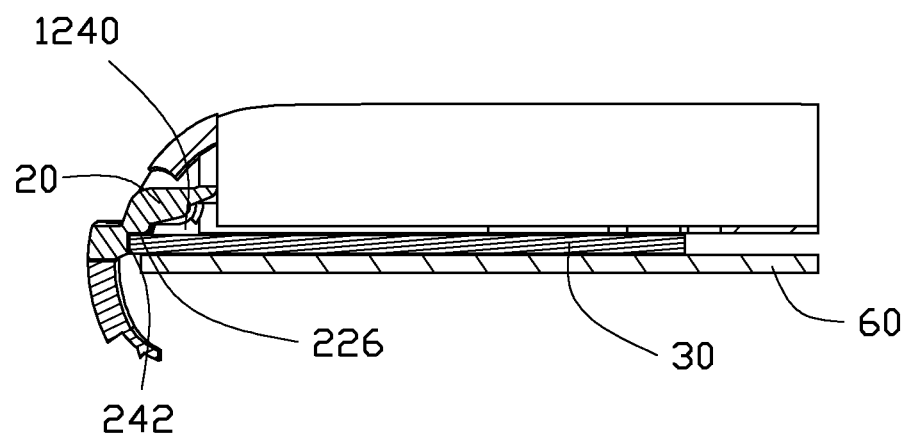
FIG. 10 is a cross-sectional view of the electronic device shown in FIG. 9, taken along line X-X thereof.

Referring to FIG. 6 and FIG. 10, when the chip card 30 is to be assembled into the housing 10, the block 2240 is pressed to drive the shafts 222 to rotate in the holes 1422 until the projections 2462 detach from the holes 1422. The block 2240 is pressed continuously to expose the opening 142. The chip card 30 passes through the opening 142, and is inserted into the receiving slot 1240. Thus, the chip card 30 electrically connects to the printed circuit board 60. The latching cover 20 is pressed to cover the opening 142. The second sidewall 226 and the resisting end 242 resist the chip card 30. Finally, the battery 50 is received in the chamber 120, and the battery cover is latched to the housing 10. Accordingly, the assembly of the electronic device 100 is finished.

When the chip card 30 is to be taken out of the housing 10, the battery cover 50 is detached, and the battery 40 is taken out of the housing 10. An external force is applied to the portion of the chip card 30 exposed from the receiving slot 1240. The chip card 30 pushes the latching plate 24 causing the projections 2462 to disengage from the connecting holes 1442. The chip card 30 is pressed to slide through the opening 142 until enough is exposed that the chip card 30 may be grasped and removed from the housing 10.

It is to be understood that the housing 10 and the latching cover 20 together make up the chip card holder 80 shown in FIG. 1.

It is to be understood that if needed in certain application environments that the peripheral wall 126 can be omitted, and the opening 142 defined in the sidewall 14.

The chip card holder 80 has a simple structure, and does not employ an ejecting mechanism to push the chip card 30 out of the housing 10, thereby saving space inside the electronic device 100.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A chip card holder for holding a chip card, the chip card holder comprising:
    a housing defining a receiving slot for receiving the chip card and an opening communicating with the receiving slot; and
    a latching cover including a main body and a latching plate, the main body rotatably assembled to the housing, the latching plate covering or uncovering the opening to allow the chip card to be removed from or inserted in the receiving slot;
    wherein the latching plate comprises a fixed block extending from each side thereof, a projection is positioned on each fixed block; the housing defines two connecting holes, the projections engaged in their respective connecting holes.

2. The chip card holder of claim 1, wherein the main body comprises a shaft extending from each side thereof; an end is formed at each side of the opening, each end defining a hole, each shaft rotatably assembled in a corresponding hole.

3. The chip card holder of claim 1, wherein the main body comprises a block mounted thereon.

4. The chip card holder of claim 1, wherein two bars symmetrically extend from the sidewall at opposite sides of the opening, each bar defining a recess, each connecting hole defined in the recess.

5. A chip card holder, comprising:
    a housing defining an opening and two holes at two sides of the opening;
    a latching cover comprising
    a main body including a shaft correspondingly positioned in the holes; and
    a latching plate connecting the main body and covering the opening;
    wherein the latching plate comprises two fixed blocks extending from two end surfaces thereof, a projection is positioned on each fixed block; the housing defines two connecting holes, the projections are engaged in the connecting holes.

6. The chip card holder of claim 5, wherein the main body comprises an end portion positioned at each end thereof, each shaft extending from the end portion; each shaft rotatably assembled in its corresponding hole.

7. The chip card holder of claim 5, wherein the housing comprises a top wall and a sidewall connected to the top wall, a receiving slot is defined in the top wall, the opening defined in the sidewall, the opening communicates with the receiving slot; a chip card can be inserted into the opening and exposed from the receiving slot.

8. The chip card holder of claim 7, wherein two bars extends from the sidewall symmetrically positioned at two sides of the opening, each bar defines a recess, each connecting hole defined in the recess.

9. The chip card holder of claim 7, wherein the main body comprises a block mounted thereon.

10. An electronic device for receiving a chip card, comprising:
    a chip card holder comprising
    a housing defining a receiving slot for receiving the chip card and an opening communicating with the receiving slot; and
    a latching cover including a main body and a latching plate, the main body rotatably assembled to the housing, the latching plate covering or uncovering the opening to allow the chip card to remove from the receiving slot;
    wherein the latching plate comprises a fixed block extending from each side thereof, a projection is positioned on each fixed block; the housing defines two connecting holes, the projections engaged in their respective connecting holes.

11. The electronic device of claim 10, wherein the main body comprises two shafts extending from two opposite side thereof; two opposite ends are formed at two sides of the opening, each end defines a hole, each shaft rotatably assembled in its corresponding hole.

12. The electronic device of claim 10, wherein the main body comprises a block mounted thereon.

13. The electronic device of claim 10, wherein two bars extends from the sidewall symmetrically positioned at two sides of the opening, each bar defines a recess, each connecting hole is defined in the recess.

\* \* \* \* \*